United States Patent [19]
Kappel

[11] Patent Number: 5,400,063
[45] Date of Patent: Mar. 21, 1995

[54] METHOD FOR OPTIMIZING A CONDUCTOR-PATH LAYOUT FOR A PRINT HEAD OF AN INK PRINTING DEVICE, AND A CONDUCTOR-PATH LAYOUT FOR SUCH A PRINT HEAD

[75] Inventor: Andreas Kappel, München, Germany

[73] Assignee: Mannesmann Aktiengesellschaft, Düsseldorf, Germany

[21] Appl. No.: 992,754

[22] Filed: Dec. 18, 1992

Related U.S. Application Data

[63] Continuation of Ser. No. 715,795, Jun. 14, 1991, abandoned.

[30] Foreign Application Priority Data

Dec. 14, 1988 [EP]   European Pat. Off. ........... 88120855

[51] Int. Cl.$^6$ .............................................. B41J 2/05
[52] U.S. Cl. ...................................... 347/58; 347/208
[58] Field of Search .............. 346/1.1, 140, 75, 76 PH

[56] References Cited

U.S. PATENT DOCUMENTS 4,847,630   7/1989   Bhaskar ........................... 346/140 X
4,873,622  10/1989   Komoro ............................ 346/140

Primary Examiner—Joseph W. Hartary
Attorney, Agent, or Firm—Horst M. Kasper

[57] ABSTRACT

A substantially uniform and nevertheless low feed line resistance of the conductor paths ($L_i$) can be realized for all heating elements in an ink jet printer by a suitable dimensioning of a transition structure (UV) of a conductor path layout disposed on a thin-film substrate. This transition structure connects the conductor paths of close spacing (LA) in the region of the heating elements (RH) to the conductor paths of wide spacing (LB) in the region of the bonding contacts to each other. For this purpose a dimensioning requirement is required, which in case of predetermined input values, i.e. the conductor path widths ($d_a$, $d_b$) and the separation distance widths ($s_a$, $s_b$) furnishes in the two regions and in the separation distance width ($s_v$) of the transition structure (UV) as starting value the conductor width ($d_v$) in the transition structure (UV).

8 Claims, 3 Drawing Sheets

METHOD FOR OPTIMIZING A CONDUCTOR-PATH LAYOUT FOR A PRINT HEAD OF AN INK PRINTING DEVICE, AND A CONDUCTOR-PATH LAYOUT FOR SUCH A PRINT HEAD

CROSS-REFERENCE TO RELATED APPLICATIONS

This is a continuation of application Ser. No. 07/715,795, filed Jun. 14, 1991, now abandoned which in turn is a continuation-in-part application of another international application filed under the Patent Cooperation Treaty on Dec. 12, 1989, bearing Application No. PCT/EP89/01526.

This application is a continuation-in-part application of another international application filed under the Patent Cooperation Treaty Dec. 12, 1989, bearing Application No. PCT/EP89/01526, and listing the United States as a designated and/or elected country. The entire disclosure of this latter application, including the drawings thereof, is hereby incorporated in this application as if fully set forth herein.

BACKGROUND OF THE INVENTION

1. Field of the Invention

The invention relates to a method for the optimization of a conductor-path layout for a print head in an ink jet printers as well as a conductor-path layout for such a print head, wherein a plurality of heating elements is selectively controlled via conductor paths, and wherein the conductor paths are distributed on a thin-film substrate to a terminal connector field.

2. Brief Description of the Background of the Invention Including Prior Art

The uniformity in heating capability of the heating resisters as well as of feed line resisters have to be assured in the high resolution ink print devices operating according to the bubble jet principle. Otherwise, the volumes of heat, generated in various heating elements of a print head, vary under certain circumstances such that some heating elements are overloaded. This can result in the reduction of the life time of a print head or also in a reduction of the maximum operating frequency by uncontrolled evaporation processes in the ink. In case of known thin-film layouts for such print heads, each individual heating element comprises its own electrical feed and return line in the structure of the metallic conductor paths, preferably made of aluminum which, for the purpose of an external electrical contacting, are distributed at individual conductors of a connection cable via the area of the thin-film substrate, and are led to a connector terminal field.

The electrical resistance of the feed lines i.e. of a feed line and of a return line, of the heating element is usually about $RZ = 20 \, \Omega$ and cannot be neglected any longer as compared to the resistance of the heating element itself with RH equal to about $80 \, \Omega$.

Since the heating elements are disposed in a near-edge region of the thin-film substrate in one row with narrow subdivision, and since the feed lines have to be led on the opposite side of the thin-film substrate for the purpose of forming a contact to the relatively wide connection field, there result also different feed line resistances for the individual heating elements based on the different lengths of the conductors, which leads to the above recited problems.

Conductor path layouts for the individual connection of heating elements are known from the Japanese Patent documents JP-A-61-2,575 and JP-A-60-76,355. These references teach that the connection lines, starting from the heating elements to be contacted, are subdivided into a region with wide spacing, into a region with close spacing, where this region adjoins a connection of an integrated circuit, and into a transition region connecting the two aforementioned regions. The connection lines run parallel to each other in these individual regions and, in order to achieve a substantially equal feed-in resistance of the individual connection lines, resistance correction zones are provided either only on one side at the heating elements to be contacted, as taught in the Japanese Patent document JP-A-60-76,355, or on both sides of the heating elements as taught in the Japanese Patent document JP-A-61-2,575. The correction zones and the line resistance compensation paths are therefore provided in the regions of wide spacing by sections of differing width and length of the connection lines alone.

SUMMARY OF THE INVENTION

PURPOSES OF THE INVENTION

It is an object of the present invention to furnish a method for an optimization of a conductor-path layout for print heads in ink jet printing devices constructed based on the thin-film technology.

It is a further object of the present invention to furnish a print head with a conductor-path arrangement in a thin-layer technology, where the feed line resistances are substantially identical and low for all heating elements of high-resolution ink jet print head.

It is yet further object of the present invention to optimize and to improve the reliability of a print head based on an assurance of uniform heating temperatures generated at the various heating resistors for forming ink jet bubbles.

BRIEF DESCRIPTION OF THE INVENTION

According to the present invention there is provided for a method for the optimization of a conductor-path layout for a print head in an ink print device. A plurality of heating elements are selectively controlled by conductor paths. These conductor paths, distributed on a thin-film substrate, lead to a terminal connector field. The conductor paths are subdivided into a region of close spacing and into a region of wide spacing, and the region of the close spacing is connected to the region of wide spacing via a transition structure. Based on the predetermined structural values of two conductor path regions to be connected, including the conductor paths and spacing distance widths, as well as based on the spacing distance width in the transition structure, the conductor path width in the transition structure is dimensioned, according to the following relationship $$d_v = -s_v/2 + \sqrt{s_v^2/4 + c}$$

with $$c = d_b \cdot d_a \cdot (d_b + s_b - d_a - s_a)/(d_b - d_a)$$

such that this relationship results in furnishing about the same feed line resistance to all conductor paths for the various heating elements.

A conductor-path layout for a print head in ink print devices includes a plurality of heating elements which are selectively control led via conductor paths. These conductor paths are distributed on a thin-film substrate and are led to a connector terminal field. The conductor paths are spread out starting from the heating elements to be contacted into a region with conductor paths of close spacing, and into a region, adjoining the terminal connector field with conductor paths of wide spacing. The region of close spacing and the region of wide spacing are connected via a transition structure region. The widths of the conductor paths and the separation distances formed by separation distance widths between in each case two neighboring conductor paths are constant within the respective regions and they are dimensioned different as compared to the other regions. The conductor width in the transition structure region is dimensioned such that all conductor paths exhibit about the same feed line resistance depending on the conductor path widths and the separation distance widths of the conductor paths in the regions, as well as the separation distance width in the transition region.

The conductor paths can be disposed running parallel to each other within the individual regions.

In each case the conductor paths of the regions are disposed perpendicular relative to each other.

A conductor path layout for a print head in an ink printing apparatus comprises a conductor path having at one end connector terminals to be connected at their second end for providing a current to heating elements of an ink jet print head, and having relatively wide spacings between the conductor paths for furnishing electric current to heaters of an ink jet print head. The widths of the conductor paths and the distances between the conductor paths of two neighboring conductor paths are substantially constant. Transition conductor path sections extend longitudinally perpendicular to the direction of the conductor paths associated with the connection terminals and have a second end and a defined width and defined spacings. Conductor path sections run parallel to the conductors connected to the feed terminals and connected on a first end to the transition conductor path, and to be connected on a second end to heating elements for printers and spaced closer as compared to the conductor path connected to the current feed terminals and extending parallel to the conductors connected to the current feed terminals, such as to match the spacing of the heating elements for the ink printer. The transition elements are dimensioned such as to furnish a uniform resistance for all conductors running from the current feed terminals to the heating element terminals based on a defined conductor width and on a defined conductor spacing between conductors in the transition region.

The conductor paths can be substantially disposed similar within the region of the conductor paths connected to the current feed terminals, within the region of the transition conductors, and within the region of the conductors connected to the heating elements.

The conductor paths in the transition region can be disposed in elongation direction to the conductor paths connected to the current feed terminals, and perpendicular to the conductor paths connected to the heating elements.

The conductor width can be designated as $d_a$ in the conductors connected to the current feed terminals, designated as $d_v$ in the transition region. The width of the conductors can be designated as $d_b$ in region connected to the heating elements. The separation distance between conductors, connected to the terminals, can be designated as $s_a$. The separation distance of conductors in the transition region is designated as $s_v$. The separation distance between conductors connected to the heating elements can be designated as $s_b$ and the abbreviation $c$ can designate the following expression $$c = d_b \cdot d_a \cdot (d_b + s_b - d_a - s_a)/(d_b - d_a)$$

The following relation can hold for the width of the conductors in the transition region $$d_v = -s_v/2 + \sqrt{s_v^2/4 + c},$$

and the conductor paths in the transition region do not deviate more than 20% from the above formulas.

Preferably, the conductor paths of the transition region do not deviate in their width from the following formula $$d_v = -s_v/2 + \sqrt{s_v^2/4 + c},$$

by more than 5%.

The conductor paths can be made of a metal placed on a substrate or the conductor paths can be made from aluminum.

A conductor-path arrangement for a print head in an ink jet printer for a plurality of heating elements is controlled via conductor paths. A plurality of first conductors having conductor paths are disposed parallel to each other and are furnished at a second end with terminals to be connected to heating elements for bubble-jet elements. Transition conductors having conductor paths are connected with their second ends to a first end of the conductors connected to the heating elements. Said conductors run away from a center line of the first conductors, and each transition conductor is connected to one of the first conductors, and said transition conductors run from the conductors in opposite direction depending on the position of the first conductor relative to the center line of the first conductors. Third conductors, having conductor paths, have a second end connected to the first end of the transition conductors and have a second end, forming a terminal to a plurality of current sources for the individual heating elements of the bubble-jet heaters, and are disposed at a spacing from each other which is larger than the spacing of the first conductors from each other. The distance of the third conductors is adapted to match the spaces of the current feed terminals. The electrical resistance of a combined conductor path of a first conductor, of an adjoining transition conductor, and a third conductor exhibits substantially the same resistance for all conductor paths between the terminals for the heating elements and the terminals to be connected to the current source, Preferably, the resistance of the combined conductors running from the heating element terminal to the current feed terminal does not differ by more than 10% in the conductivity relative to each other.

A low and uniform feed line resistance of the conductor paths can be realized for all heating elements based on a suitable dimensioning of the transition structure, which connects the conductor paths of close spacing in the region of the heating elements to the conductor paths of wide spacing in the region of the terminal contact. A dimensioning norm requires that the conductor width in the transition structure is assigned as a starting value to the predetermined input values, for the conductor path widths and for the spacing width of the conductor paths in the two regions and to the spacing widths in the transition structure.

The novel features which are considered as characteristic for the invention are set forth in the appended claims. The invention itself, however, both as to its construction and its method of operation, together with additional objects and advantages thereof, will be best understood from the following description of specific embodiments when read in connection with the accompanying drawings.

BRIEF DESCRIPTION OF THE DRAWINGS

In the accompanying drawings, in which are shown several of the various possible embodiments of the present invention.

DESCRIPTION OF INVENTION AND PREFERRED EMBODIMENT

Figure 1:
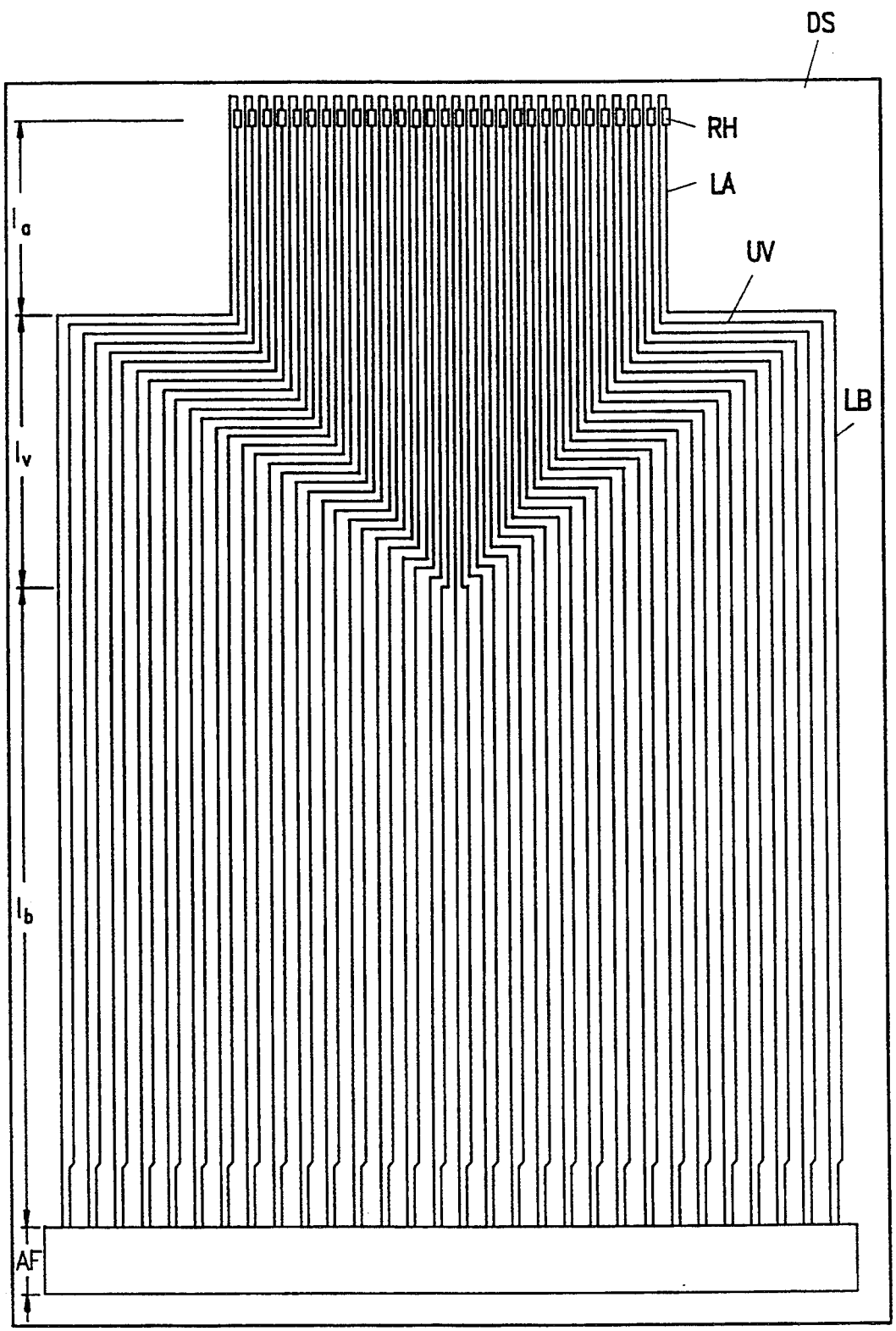
FIG. 1 is a schematic view of a conductor-path layout of a bubble jet ink print head with, in each case, a feed and return line for each heating element.

In case of the layout for the conductor-path, illustrated only schematically in FIG. 1, for an ink print head with 30 heater elements, a thin-film substrate is designated with the reference characters DS. The individual heating elements RH and their feed lines are positioned and structured on the thin-film substrate DS. These feed lines, which include for each heating element a feeding line and a return line, lead from heating elements RH, disposed in an edge region of the thin-film substrate DS, to a terminal connector field AF, disposed on the opposite side of the thin-film substrate DS. The feed lines are contacted to a connection cable, not illustrated in the drawing, at the terminal connector field. The conductor paths are spread on the thin-film substrate DS since, on the one hand, a sufficient space has to be available for performing this contacting and, on the other hand, because the heating elements RH are relatively small and disposed closely spaced relative to each other in order to achieve a high resolution capability. For this purpose the conductor paths on the thin-film substrate DS are subdivided in the region of the heating elements RH into conductor paths of close spacing LA and in the region of the terminal connector field AF into conductor paths of wide spacing LB. A transition structure UV connects the conductor paths of a close spacing LA to the conductor paths of a wide spacing LB. The lengths of these three regions are also entered in FIG. 1, wherein the conductor length of close spacing is designated with $1_A$, wherein the conductor length of the transition structure is designated with $1_v$, and wherein the conductor length of the area of a wide spacing is designated by the reference characters $1_B$.

Figure 2:
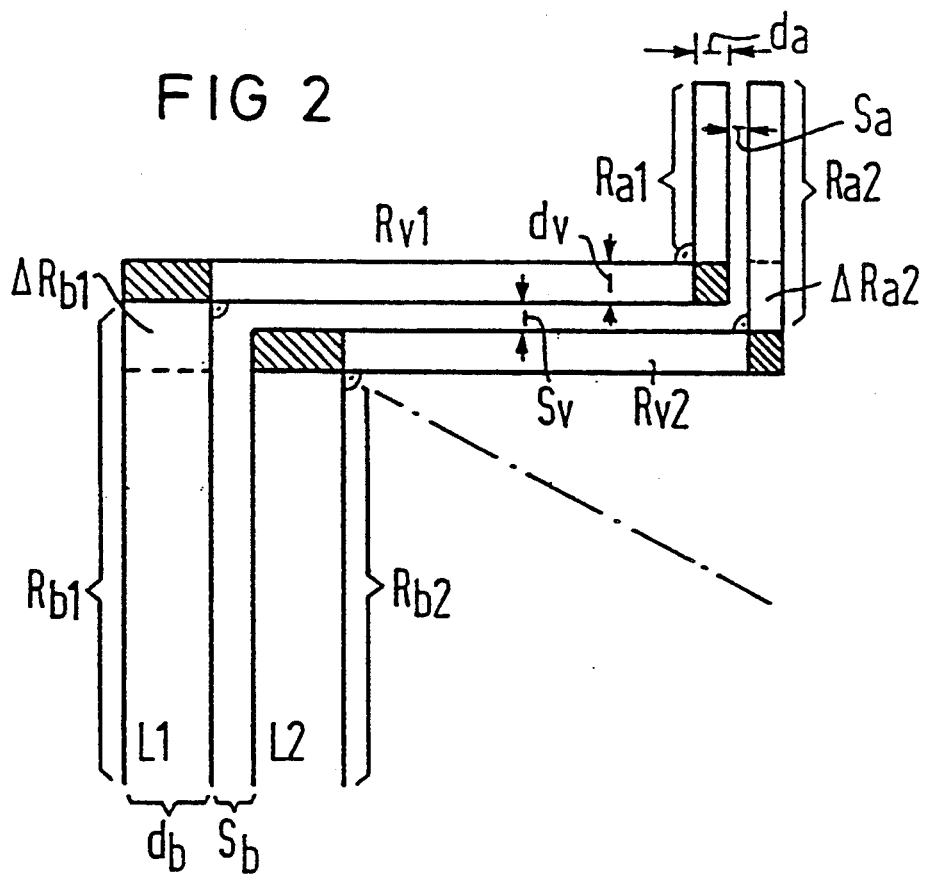
FIG. 2 is an enlarged, sectional of the conductor-path layout according to FIG. 1.

A uniform and nevertheless small feed line resistance for all heating dots can be realized by a suitable dimensioning of this transition structure UV, which transition structure connects the conductor paths of close spacing in the region of the heating elements with the conductor paths of wide spacing in the area of the terminal connector field. Reference is made to FIG. 2, which illustrates schematically an enlarged area of FIG. 1 and which illustrates the course between the two neighboring conductor paths L1, L2 in the recited three regions.

The geometric dimensions and relationships as well as the resistance contributions of the individual conductor-path sections have been entered in FIG. 2. Individually, these are the widths $d_a$, $d_v$, and $d_b$ of the conductor paths in the regions of the close spacing $L_A$, in the region of the transition structure UV, and in the region of wide spacing LB as well as distances $s_a$, $s_v$, $s_b$ between two neighboring conductor paths L1, L2 in the corresponding areas. The conductor paths within the individual regions run in general parallel to each other, whereas the conductor paths of in each case two neighboring regions are disposed at an angle of about 90° relative to each other, such that the neighboring conductor-path areas are disposed perpendicular to each other.

The optimization comprises now that the transition structure UV ($d_v$, $s_v$), which connects the conductor paths of close spacing LA ($d_a$, $s_a$) to the conductor paths of wide spacing LB ($d_b$, $s_b$), is to be dimensioned such that the electrical resistances of all feed lines are equal and thereby as low as possible.

It is sufficient, based on the symmetry of the structure illustrated in FIG. 2, to determine a functional relationship between the conductor-path separation distance $s_v$ and the conductor-path width $d_v$ such that the conductor resistors of two neighboring conductor paths L1, L2 are of equal size, i.e. $R_i = R_{i+1}$.

The corner regions, illustrated hatched in FIG. 2, are not taken into consideration in this context, since they are all equal as to their values for all conductor paths. Based on the reference numerals and designations entered in FIG. 2, the total resistance of a conductor path $L_i$ is composed of a resistance component $R_{bi}$ of the conductor path of wide spacing of a resistance component $R_{vi}$ of the transition structure and of resistance-path $R_{ai}$ of the conductor path of close spacing.

Based on the requirement that two neighboring conductor paths are to have an identical resistance, i.e.

$$0 = R_i R_{i+1}$$

and based on the relationship $R_i = R_{bi} + R_{vi} + R_{ai}$ there result the following rules for the conductor paths L1 and L2:

$$0 = R_1 - R_2 \tag{1}$$

$$R_1 = R_{b1} + R_{v1} + R_{a1} \tag{2}$$

$$R_2 = R_{b2} + R_{v2} R_{a2} \tag{3}$$

$$R_{b1} = R_{b2} + \Delta R_{b1} \tag{4}$$

$$R_{a2} = R_{a1} + \Delta R_{a2} \tag{5}$$

By insertion of the equations (2) through (4) into the equation (1), there results the relationship:

$$0 = \Delta R_{b1} + R_{v1} - R_{v2} - \Delta R_{a2} \qquad (1')$$

If the specific resistance of the conductor paths is designated as $\rho$ and if the conductor-path thickness is designated as h, then there result the following equations for the individual resistance components:

$$\Delta R_{b1} = (\rho/h) \cdot ((d_v + s_v)/d_b))$$

$$\Delta R_{a2} = (\rho/h) \cdot ((d_v + s_v)/d_a))$$

$$R_{v1} - R_{v2} = (\rho/h) \cdot ((d_b + s_b - d_a - s_a)/d_v$$

wherein $d_v$ is a conductor path width in the transition region and wherein $s_v$ is a spacing between two neighboring conductor paths in the transition region.

If these three equations are entered into the equation (1'), then a relationship for the separation distance $s_v$ of the neighboring conductor paths L1, L2 in the transition region is obtained after mathematical transformations resulting from the following equation:

$$s_v = d_b \cdot d_a \cdot (d_b + s_b - d_a - s_a)/(d_v (d_b - d_a)) - d_v$$

This separation distance $s_v$ is a function of the preset parameter distances $s_a$, $s_b$ and the conductor path widths $d_a$, $d_b$ of the conductor paths in the areas of close and wide spacings as well as of the parameter conductor-path width $d_v$ in the transition region.

Employing the abbreviation $$c = d_b \cdot d_a \cdot (d_b + s_b - d_a - s_a)/(d_b - d_a)$$

there results the following relationship for this separation width $s_v$ in the transition region:

$$s_v = c/d_v - d_v \qquad (*)$$

or transformed according to the conductor-path width $d_v$ in the transition region, there results the following equation:

$$d_v = -s_v/2 + \sqrt{s_v^2/4 + c}$$

Figure 3:
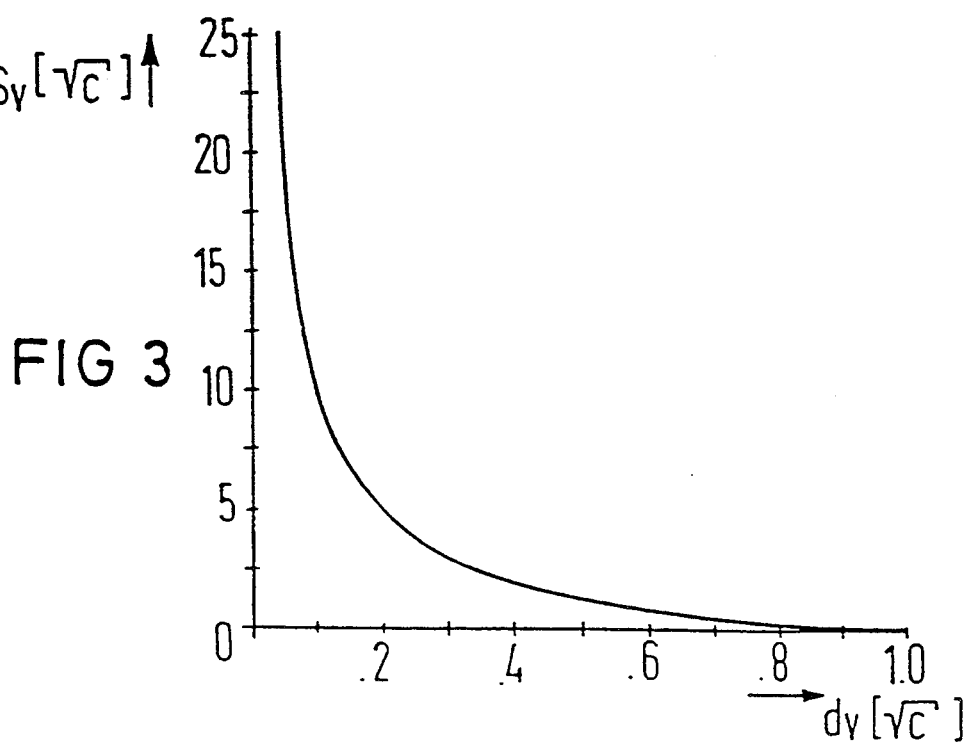
FIG. 3 illustrates the separation distance width between conductors depending on the conductor thickness in the transition structure.

The equation (*) is illustrated in a general form with $s_v$, $d_v$ furnished in units of $\sqrt{c}$ in FIG. 3. The conductor-path width $d_v$ is plotted in the abscissa and the separation distance width $s_v$ is plotted on the ordinate. The equation (*) has a zero position at the value $d_v = \sqrt{c}$, i.e. for the conductor widths in the transition region UV with $d_v > \sqrt{c}$, there cannot be achieved equality of the line resistances since in this region, the separation distance $s_v$ width becomes negative. In particular, the transition conductor paths are contacting each other at the value $d_v = \sqrt{c}$.

The sum of the resistances of feed and return conductors is designated as total feed line resistance $R_{ges} = 2 \cdot R_g$. The resistance of a feed line $R_g$ is composed proportionally from the resistance contributions of the conductors of close spacing LA, of the conductors of wide spacing LB, and of the conductors of the transition structure UV.

Since the electrical resistance of all conductors in this transition structure UV is of equal value, there results the following equation based on the equation (*):

$$R_v = (\rho/h) \cdot ((n_{max} - 1) \cdot (s_v + d_v)/d_a)$$

wherein $n_{max}$ is equal to half the conductor number of the print heat, for example, $n_{max} = 30$ in case of 30 heating elements.

Thus, there results according to FIG. 1 for the total resistance $R_g$ of a feed line, which can be a feed-in line or a return line:

$$R_g = R_a + R_v + R_b =$$

$$(\rho/h) \cdot (l_a/d_a + (n_{max} - 1) \cdot ((s_v + d_v)/d_a) + l_b/d_b)$$

with $$l_b = l_g - l_a - ((n_{max} - 1) \cdot (s_v + d_v) + d_v)$$

with the following equation results for the total resistance of a feed line:

$$R_g = (\rho/h) \cdot (1_a/d_a + (n_{max} - 1) \cdot (1 - /d_a - 1/d_b) \cdot c/d_v + ((l_g - l_a - d_v)/d_b), \, l_b \geq 0 \qquad (**)$$

For a print head with 30 heating elements and a resolution of 180 dots per inch (dpi) with the following external dimensions of the thin-film substrate DS, as illustrated in FIG. 1 or, respectively, the, preset input values

| | |
|---|---|
| $d_a = 50 \, \mu m$, | $s_a = 20.5 \, \mu m$ |
| $d_b = 100 \, \mu m$, | $s_b = 30.0 \, \mu m$ |
| $l_g = 8658 \, \mu m$, | $l_a = 1547.0 \, \mu m$ | there result the following values summarized in table 1 for the conductor-path widths $d_v$, the separation distance width $s_v$, and the length of the transition structure $1_v$, as well as the total resistance $R_g$ based on a consideration of the specific resistance of thin aluminum layers $\rho_{Al} = 3 \cdot 10^8 \, \Omega m$, as they can be employed for conductor paths and of a conductor path thickness h of 0.5 micrometer:

TABLE 1

| $d_v$ ($\mu m$) | $s_v$ ($\mu m$) | $1_v$ (mm) | $R_g$ ($\Omega$) |
|---|---|---|---|
| 30.0 | 168.3 | 5.76 | 9.6 |
| 40.0 | 108.8 | 4.36 | 8.7 |
| 50.0 | 69.0 | 3.50 | 8.2 |
| 60.0 | 39.2 | 2.94 | 7.8 |
| 67.6 | 20.5 | 2.54 | 7.6 |
| 70.0 | 15.0 | 2.62 | 7.56 |

A second example is provided by a print head with 300 dots per inch (dpi) resolution capability and 50 heating elements, where the outer dimensions are identical to the dimensions of the above recited print head of 180 dots per inch (dpi).

The input values:

| The input values: | |
|---|---|
| $d_a = 21.83 \, \mu m$, | $s_a = 20.5 \, \mu m$ |
| $d_b = 48.00 \, \mu m$, | $s_b = 30.0 \, \mu m$ |
| $l_g = 8658 \, \mu m$, | $l_a = 1547 \, \mu m$ |
| $n_{max} = 50$ | |
| $\rho_{Al} = 3 \cdot 10^{-8} \, \Omega \, m$ | |
| $h = 0.5 \, um$ | | will result in the values listed in Table 2 for the 300 dpi print head

TABLE 2

| $d_v$ (μm) | $s_v$ (μm) | $l_v$ (mm) | $R_g$ (Ω) |
|---|---|---|---|
| 10.0 | 132.3 | 7.01 | 23.6 |
| 15.0 | 80.8 | 4.68 | 20.1 |
| 20.0 | 51.4 | 3.52 | 18.4 |
| 25.0 | 32.1 | 2.82 | 17.3 |
| 28.9 | 20.5 | 2.45 | 16.7 |
| 30.0 | 17.6 | 2.36 | 16.6 |
| 35.0 | 5.8 | 2.03 | 16.1 |

With a separation distance width $s_v=20.5$ micrometers, the total feed line resistance for each heating element will then amount for the 180 dpi resolution print head: $R_{ges}=2\cdot R_g=15.2$ Ω and in case of the 300 dpi print head $R_{ges}=2\cdot R_g=33.4$ Ω.

Figure 4:
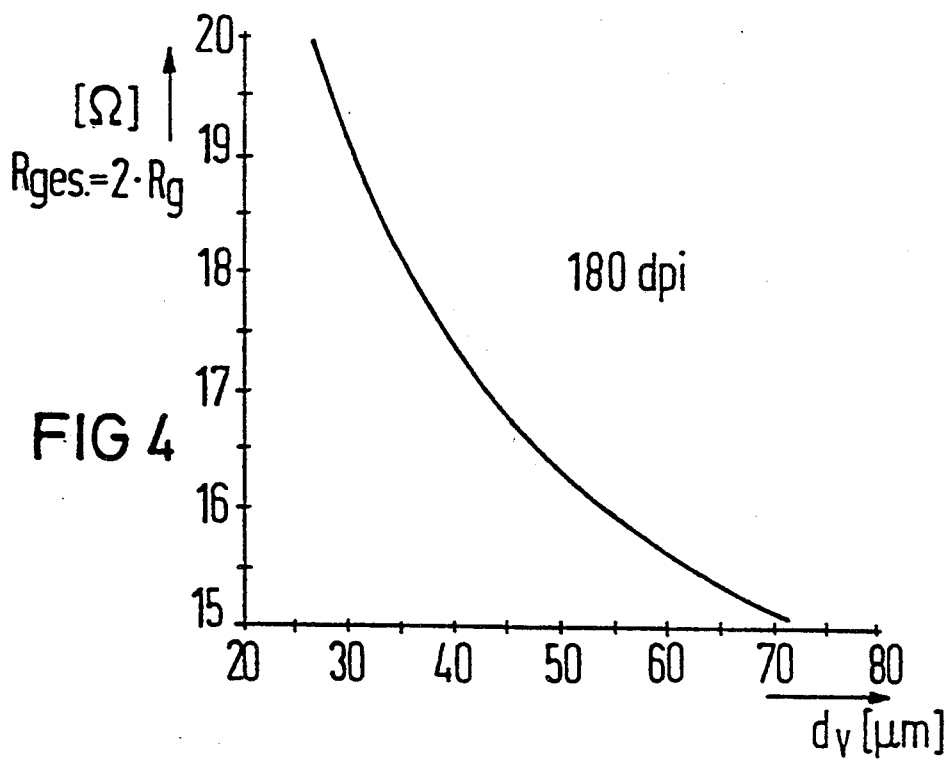
FIG. 4 shows a diagram of the functional relationship between the total feed line resistance and the conductor-path widths for a first print head with a resolution of 180 dots per inch.
Figure 5:
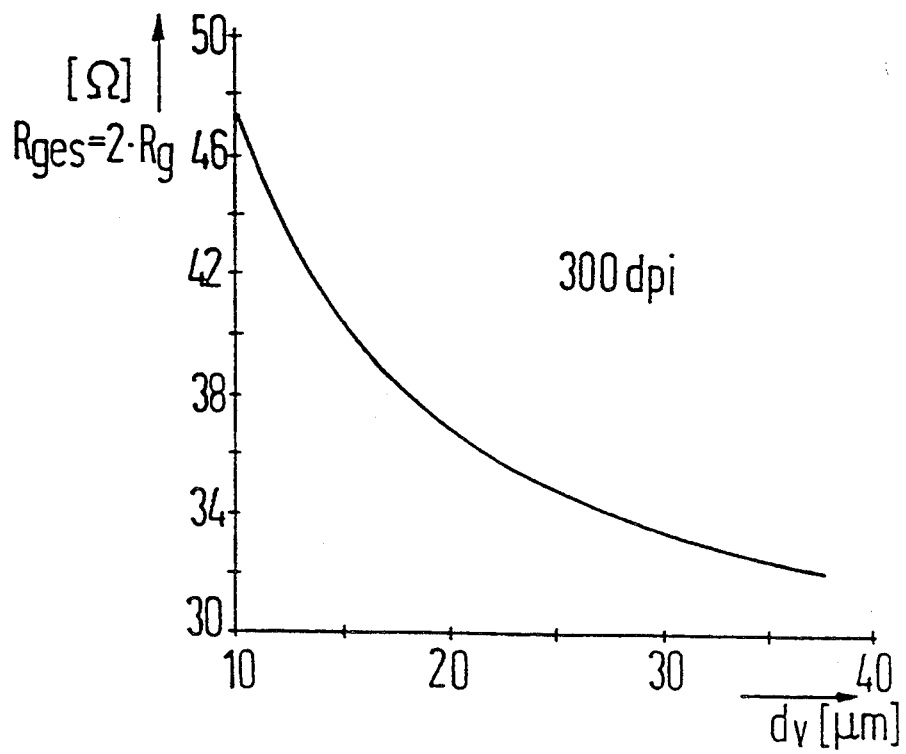
FIG. 5 shows a diagram of the functional relationship between the total feed line resistance and the conductor-path widths for a second print head with a resolution of 300 dots per inch.

The total feed line resistances $R_{ges}=2\cdot R_g$ are illustrated in FIGS. 4 and 5 for a presumed aluminum thickness of $h=0.5$ as functions of the conductor path width $d_v$ of the transition structure UV, first for a 180 dpi print head in FIG. 5.

It will be understood that each of the elements described above, or two or more together, may also find a useful application in other methods for the optimizing of a conductor-path structure differing from the types described above.

While the invention has been illustrated and described as embodied in the context of a method for the optimizing of a conductor-path structure for a print head in an ink print device and a conductor-path arrangement for such a print head, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims:

1. A print head in an ink printing apparatus, with a conductor path structure comprising
    first conductor path sections each having at one end connected to a respective connector current feed terminal and to be connected at a second end to heating elements of an ink jet print head, and having defined distance spacings between the conductor paths of the first conductor path sections for furnishing electric current to heaters of an ink jet print head, and wherein the widths of the conductor paths and the distance spacings between the conductor paths of two neighboring conductor paths are substantially constant;
    a transition conductor path region including transition path sections extending longitudinally perpendicular to the direction of the first conductor path sections and connected with a first end to a second end at the first conductor path sections and having a second end and having a defined width and having defined mutual distance spacings;
    a second conductor path region including second conductor path sections running parallel to the first conductor path sections and connected on a first end to the second end at the transition conductor path sections, and connected on a second end to the heating elements for printers and spaced closer as compared to the first conductor path sections such as to match a spacing of the heating elements for the ink printer, wherein the conductor paths in the transition conductor path region are dimensioned such as to furnish a uniform resistance for all conductor paths running from the current feed terminals to the heating elements based on a defined conductor path width and on a defined distance spacing between the conductor paths sections in the transition conductor path region
    wherein the conductor path width is designated as $d_b$ in a region of the conductor paths connected to the connector terminals, designated as $d_v$ in a region of the transition conductor paths, and wherein the width of the conductor paths is designated as $d_a$ in a region connected to the heating elements, wherein the distance spacings between the conductor paths, connected to the connector terminals, is designated as $s_b$, wherein the distance spacings between the conductor paths in the region of the transition conductor paths is designated as $s_v$, and wherein the distance spacings between conductor paths connected to the heating elements is designated as $s_a$ and wherein the abbreviation c designates the following expression $$c = d_b \cdot d_a \cdot (d_b + s_b - d_a - s_a)/(d_b - d_a)$$

and wherein the following relation holds for the width of the conductor paths of the region of the transition conductor paths $$d_v = -s_v/2 + \sqrt{s_v^2/4 + c},$$

and wherein the conductor paths in the region of the transition conductor paths do not deviate more than 20% from the above formulas.

2. The print head according to claim 1, wherein the conductor paths are substantially disposed similar within the region of the conductor paths connected to the connector terminals, within the region of the transition conductor paths, and within the region of the paths connected to the heating elements.

3. The print head according to claim 1, wherein the conductor paths in the region of the transition conductor paths are disposed in elongation direction to the conductor paths connected to the connector terminals, and perpendicular to the conductor paths connected to the heating elements.

4. The print head according to claim 1, wherein the conductor paths of the region of the transition conductor paths do not deviate in their width from the following formula $$d_v = -s_v/2 + \sqrt{s_v^2/4 + c},$$

by more than 5%.

5. The print head according to claim 1, wherein the conductor paths are made of a metal placed on a substrate.

6. The print head according to claim 1, wherein the conductor paths are made from aluminum.

7. The print head according to claim 1, wherein the conductor paths are disposed substantially similar within the region of the conductor paths connected to the current feed terminals, within the region of the transition conductors, and within the region of the conductors connected to the heating elements, wherein the conductor paths in the transition region are disposed in elongation direction to the conductor paths connected to the current feed terminals, and perpendicular to the conductor paths connected to the heating elements, wherein the conductor-paths of the transition region do not deviate in their width from the following formula $$d_v = -s_v/2 + \sqrt{(s_v^2/4 + c)},$$

by more than 5%, wherein the conductor paths are made of a metal placed on a substrate.

8. The print head according to claim 1, wherein the conductor paths are produced by thin film technology, wherein the feed line resistances are substantially equal and low, wherein the temperature generated by heating the heating elements are heated up substantially to the same temperature.

* * * * *